United States Patent [19]

Perlman

[11] Patent Number: 5,254,296
[45] Date of Patent: Oct. 19, 1993

[54] METHOD TO DOUBLE THE PIEZO-AND PYROELECTRIC OF POLYVINYLIDINE FLUORIDE (PVDF) FILMS

[75] Inventor: Martin M. Perlman, Montreal, Canada

[73] Assignee: Her Majesty the Queen in right of Canada, as represented by the Minister of National Defence, Ottawa, Canada

[21] Appl. No.: 791,275

[22] Filed: Nov. 13, 1991

[30] Foreign Application Priority Data

Dec. 11, 1990 [CA] Canada ................................ 2032015

[51] Int. Cl.⁵ ............................................. B29C 35/00
[52] U.S. Cl. ...................................... 264/22; 264/24; 264/288.4; 425/174.8 E
[58] Field of Search .................. 264/22, 24, 288.4; 425/174.8 E

[56] References Cited

U.S. PATENT DOCUMENTS

| | | | |
|---|---|---|---|
| 4,265,841 | 5/1981 | Fujimori et al. | 264/22 |
| 4,308,370 | 12/1981 | Fukada et al. | 264/22 |
| 4,345,359 | 8/1982 | Micheron | 264/22 |
| 4,403,382 | 9/1983 | Facoetti et al. | 264/22 |
| 4,427,609 | 1/1984 | Broussoux et al. | 264/24 |
| 4,481,158 | 11/1984 | Georlette et al. | 264/22 |
| 4,557,880 | 12/1985 | Pantelis | 264/104 |
| 4,668,449 | 5/1987 | Soni et al. | 264/22 |
| 4,800,048 | 1/1989 | Bloomfield | 264/24 |

FOREIGN PATENT DOCUMENTS 734901  5/1980  U.S.S.R. ................................ 264/22

*Primary Examiner*—Jeffery Thurlow
*Attorney, Agent, or Firm*—Nixon & Vanderhye

[57] ABSTRACT

Polyvinylidene fluoride (PVDF) films and co-polymers thereof possess the highest values of piezoelectric and pyroelectric constants of any known polymer. These films, up to present, have been first subjected to stretching and then to a high electric field (or corona charge) at an elevated temperature to provide a maximum piezoelectric constants ($d_{31}$) of about 30-35 pC/N and a maximum pyroelectric constants (p) of about 3.5 nC/cm²K. It has now been found that the piezoelectric constant $d_{31}$ and pyroelectric constant p of these films can be increased up to about 60 pC/N and 6 nC/cm²K respectively when they are subjected to simultaneously stretching and corona poling with a poling field $E_p = 0.55$ MV/cm, a stretching ratio S.R. $= 4.5$X and a poling temperature $T_p = 80°$ C.

13 Claims, 4 Drawing Sheets

METHOD TO DOUBLE THE PIEZO-AND PYROELECTRIC OF POLYVINYLIDINE FLUORIDE (PVDF) FILMS

FIELD OF THE INVENTION

The present invention is directed to polymer films with piezoelectric and pyroelectric properties and in particular to polyvinylidene fluoride (PVDF) films and co-polymers thereof with greatly enhanced piezoelectric and pyroelectric properties.

BACKGROUND OF THE INVENTION

Polyvinylidene fluoride (PVDF) films possess the highest values of piezoelectric and pyroelectric constants of any known polymer. PVDF is semicrystalline and contains at least two stable forms, a polar form I containing $\beta$-crystallites and a non-polar form II containing $\alpha$-crystallites. The $\beta$-form has an extended all-trans (planar zig-zag) polar conformation. The $\alpha$-form has a trans-gauche-trans-gauche' (T-G T-G') non-polar conformation. Uniaxial stretching and subsequently subjecting these films to high electric elevated temperature converts the $\alpha$-crystallite to the $\beta$-form and aligns dipoles giving rise to large polarizations.

It has been assumed, up to present, that saturation of the polarization of these films is obtained by first stretching the films and subsequently subjecting them to corona poling. If both sides of these films are metallized and A.C. voltages applied, the films will vibrate due to the piezoelectric effect. If the temperature of these metallized films is raised, a current output will be obtained due to the pyroelectric effect. The converse of these later two statements also applies. The maximum values for the piezoelectric constant ($d_{31}$) and pyroelectric constant (p) that so far have been reported with these type of films are 30–35 pC/N and 3.5nC/cm$^2$K respectively where C is Coulombs, N is Newtons and K is degrees Kelvin.

SUMMARY OF THE INVENTION

It is an object of the present invention to provide a method of treating polymer films, such as PVDF films and co-polymers thereof, that results in greatly enhanced piezoelectric and pyroelectric properties which is accomplished by Simultaneously Stretching and Corona Poling (SSCP) these polyvinylidene fluoride films to provide an enhanced $\beta$ phase.

BRIEF DESCRIPTION OF THE DRAWINGS

The following detailed description of the invention will be more readily understood when considered in conjunction with the accompanying drawings, in which.

DESCRIPTION OF THE PREFERRED EMBODIMENT

Figure 1:
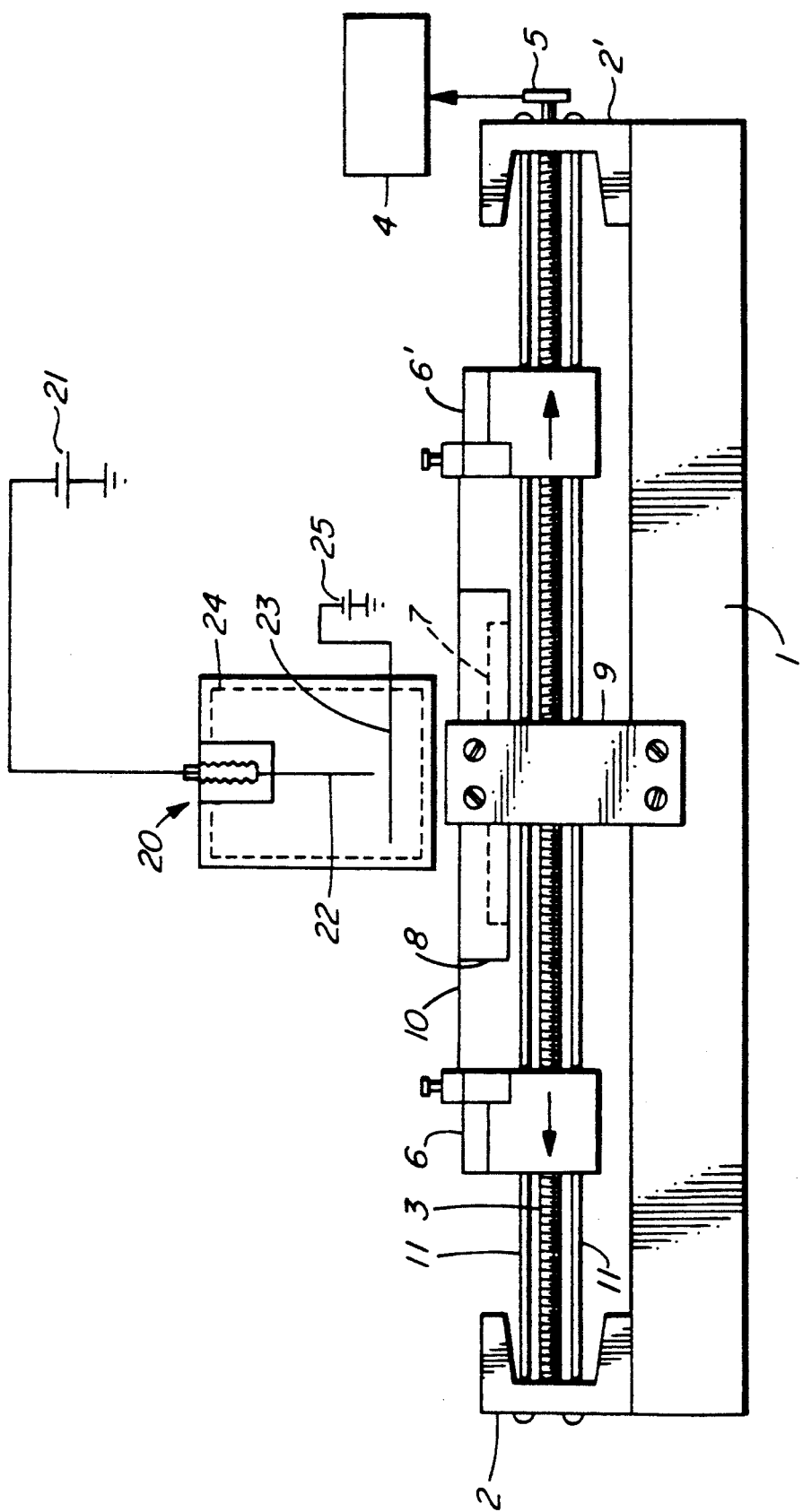
FIG. 1 illustrates an apparatus for simultaneously stretching and corona poling a PVDF film at elevated temperatures according to the present invention.

FIG. 1 shows an apparatus that can be used to Simultaneously Stretch and Corona Pole (SSCP) PVDF or PVDF-TriFE films, where FE is fluoroethylene, in a batch mode manufacturing process. This process may be easily converted into a continuously moving film mode of manufacture where stretching is performed by using a film take-up roll whose circumferential speed is faster than that of a heated feed roll, the film being simultaneously corona charged as it is being stretched while being kept heated, in an oven or by other heating means, at a predetermined temperature.

An elongated base 1, as shown in FIG. 1, is provided with a support 2 at one end and a support 2' at the other end. The supports 2 and 2' hold a rotatable shaft 3 in position above the base 1. Shaft 3 is threaded in one direction on the left half portion which is rotatably supported by 2 and threaded in the other direction on the right half portion which is rotatably supported by 2'. A gear 5 at one end of the shaft 3 is connected to a geared motor 4 in order to rotate shaft 3 in a controlled manner. A support 9 at a central part of base 1 holds a platform 8 above rotatable shaft 3 so that a PVDF or PVDF-TriFE film 10 can be supported on platform 8. The ends of film 10 are clamped in a clamp 6 on the left side of platform 8 and a clamp 6' on the right side of platform 8, 6 and 6' having threaded central bores which engage threaded shaft 3. Rods 11, which are held parallel to shaft by supports 2 and 2', also extend through bores in clamps 6 and 6' so that these clamps can slide along rods 11. Clamps 6 and 6' will move in opposite directions when shaft 3 is rotated by motor 4 due to shaft 3 being threaded in one direction on the left end and the other direction o the right end.

A heater 7 in platform 8 heats film 10 to a required temperature and shaft 3 is then rotated at a set speed in a direction to move clamp 6 to the left and clamp 6' to the right which stretches the film at a predetermined rate. A device 20 located above film 10 and platform 8 subjects the film 10 to a high electric field or corona charge at the same time as the heated film is being stretched in order to produce a SSCP film.

The device 20 consists of a high voltage source 21 connected to a corona needle 22 in device 20 which contains a shield 24. A grid 23 is placed under the point of needle 22 between that point and film 10 with the grid being electrically connected to controlled voltage source 25 in order to control the surface potential of the film.

PVDF films 50$\mu$ and 100$\mu$ thick, supplied by Solvay et Cie., Societe Anonyme, Bruxelles, were first cleaned with ethanol and distilled water and then dried at 60° C.

for 2 hours. These were then simultaneously stretched and corona poled (SSCP) in the type of apparatus shown in FIG. 1 so that the films were stretched from both ends with the middle portion always remaining under the corona charger. The SSCP film samples were formed at elevated temperatures of from 60° to 110° C. with a stretching speed maintained at 9 cm/min. The surface potential on the films was controlled by the voltage on grid 23 placed under the needle point of a standard corona charger. These negatively charged films were allowed to cool under corona for ½ hour. Samples 2 cm by 6 cm were cut from the portion of film that remained under corona during stretching. Then aluminum electrodes 500 Å thick having an area 0.5 cm by 4 cm were vacuum deposited on each side of the samples. The electrodes on each side of the samples were electrically connected to provide a short circuit between them and these samples were then kept at 60° C. for 24 hours before any measurements were taken to determine points on the graphs shown in FIGS. 2 to 5.

The piezoelectric constants $d_{31}$ for points on the graphs were determined using the static method wherein the charge induced on the electrodes at room temperature by a weight attached to the film were measured with an electrometer and X-Y recorder, $d_{31}$ being calculated from $$d_{31} = (Q/A)(tw/F) \quad (1)$$

where Q is the induced charge, A is the electrode area, t is the thickness, w the width of the sample and F is the applied force.

Figure 6:
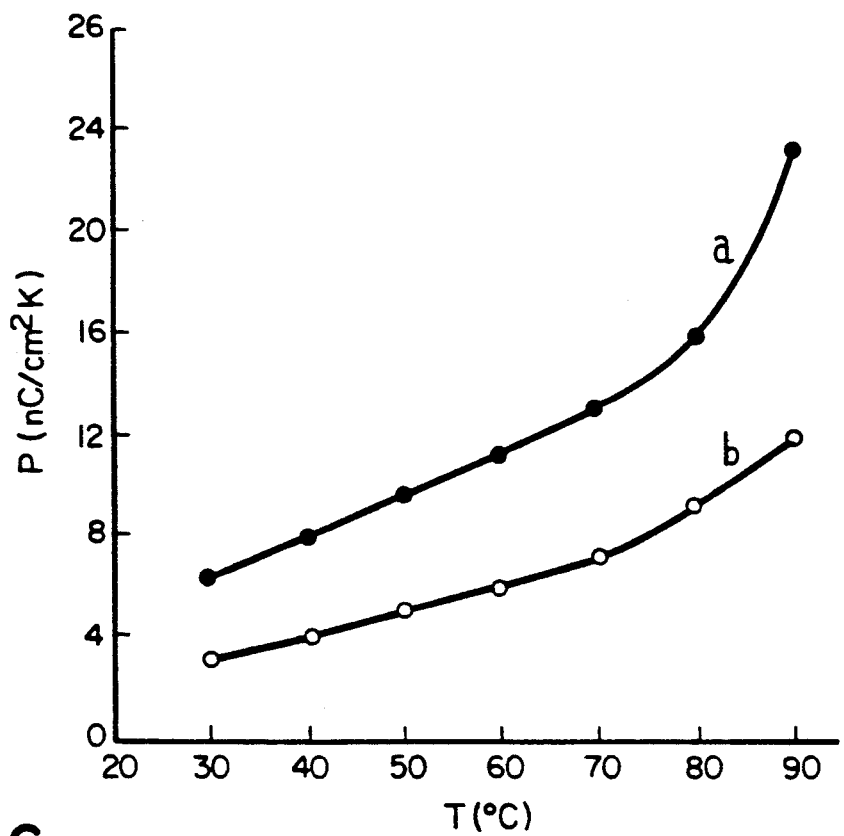

The pyroelectric constants p for points on the curves shown in FIG. 6 were determined from current (I) measurements using the formula $$p = IA/\beta \quad (2)$$

where A is the electrode area and $\beta$ is the heating rate. The samples were first heated to 90° C. at 2° C/min and kept at this temperature for 1 hour to eliminate any trapped space charge. They were then cooled to room temperature with subsequent heating and cooling runs being reproducible showing true pyroelectric currents.

Figure 2:
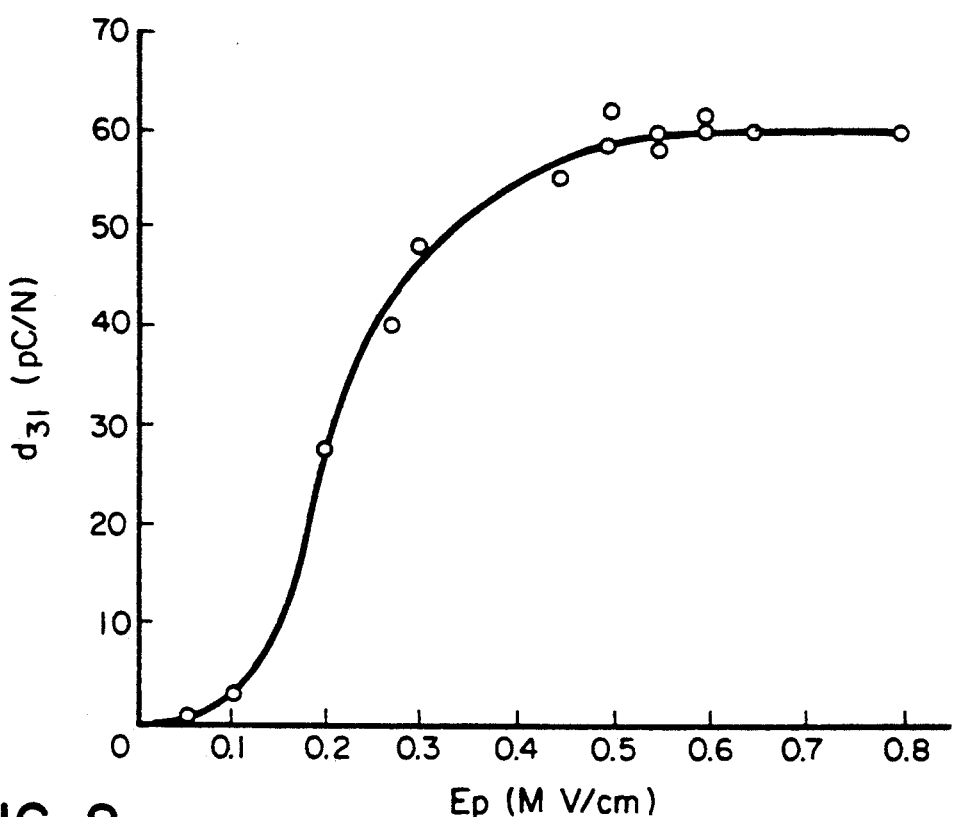
FIG. 2 is a graph of measured piezoelectric constants ($d_{31}$) vs. poling field ($E_p$) for SSCP PVDF films produced with a poling temperature ($T_p$) of 80° C. and a stretching ratio (S.R.) of 4.5×.

FIG. 2 is a graph of measured piezoelectric constants $d_{31}$ vs poling field $E_p$ for a number of samples of films produced using different poling fields ($E_p$), which fields ranged from 0.05 to 0.8MV/cm. The piezoelectric constant $d_{31}$ 1 is a maximum of about 60 pC/N and saturates with a poling field higher than 0.5 MV/cm which is due to saturation of the number of crystallites and/or dipoles aligned in the field direction. These samples were produced at a poling temperature ($T_p$) of 80° C. with a stretching ratio (S.R.) of 4.5×.

Figure 3:
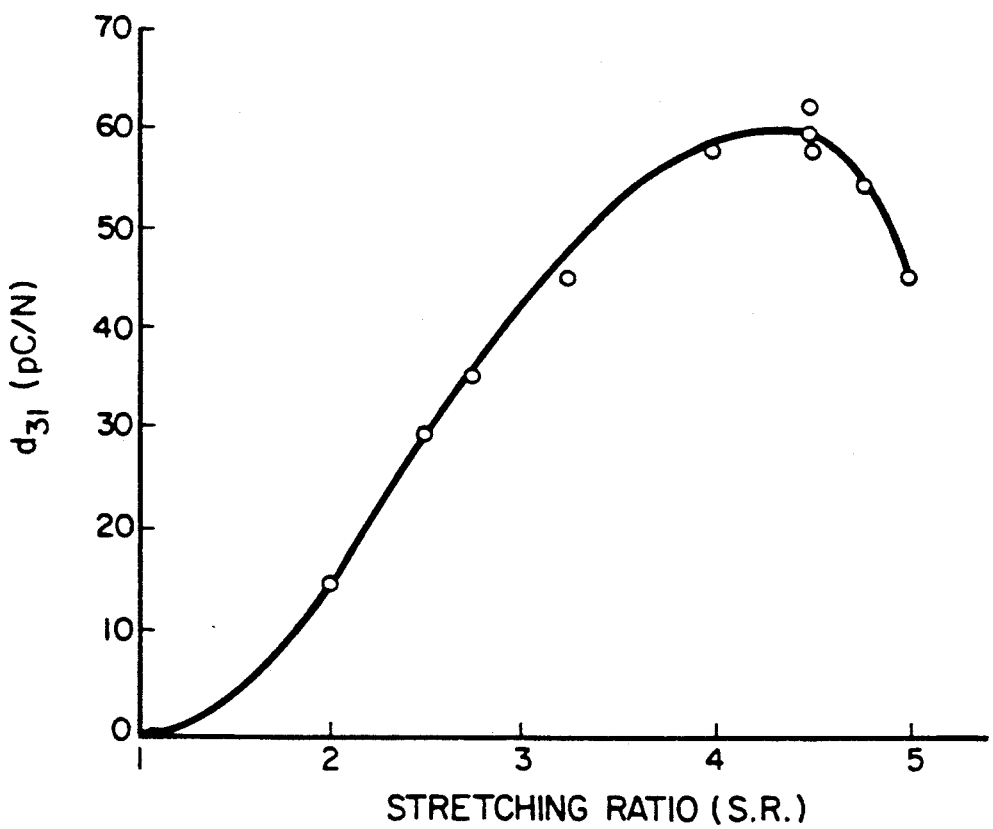
FIG. 3 is a graph of measured piezoelectric constants ($d_{31}$) vs. stretching ratio (S.R.) for SSCP PVDF films produced with a poling temperature ($T_p$) of 80° C. and a poling field $E_p$ of 0.55 MV/cm.

FIG. 3 is a graph of measured piezoelectric constants $d_{31}$ vs stretching ratio (S.R.) for a number of film samples manufactured using different stretching ratios. The maximum value for the piezoelectric constant $d_{31}$ of about 60 pC/N was obtained when the stretching ratio (S.R.) was about 4.5×. These film samples were manufactured using a poling temperature ($T_p$) of 80° C. and a poling field ($E_p$) of 0.55 MV/cm.

Figure 4:
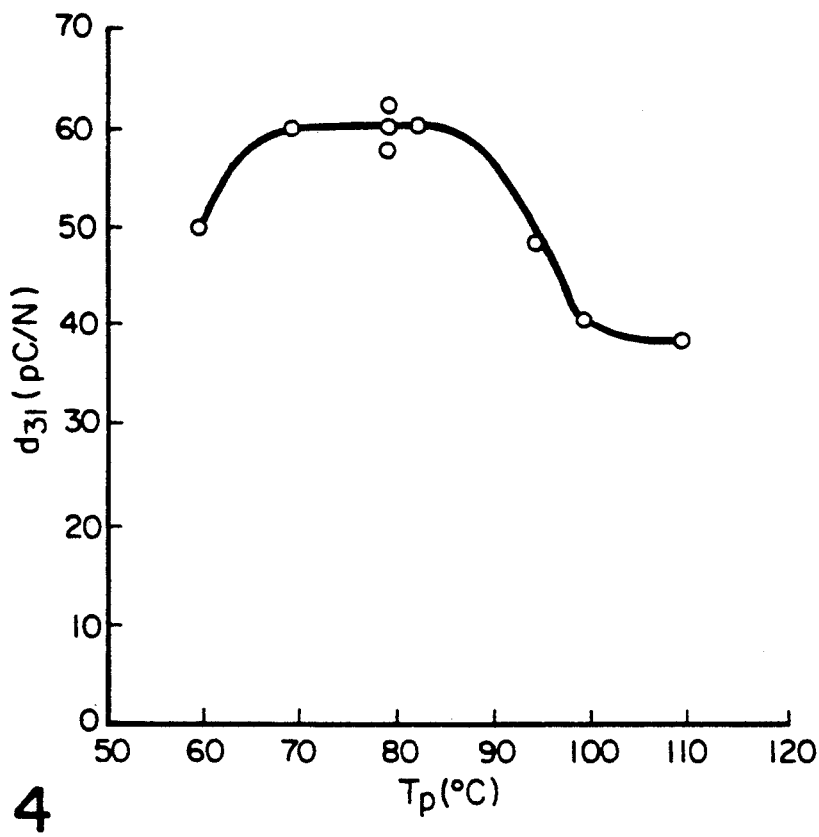
FIG. 4 is a graph of measured piezoelectric constants ($d_{31}$) vs. poling temperature ($T_p$) for SSCP PVDF films produced with a poling field $E_p$ of 0.55 MV/cm and a stretching ratio S.R. of 4.5×, FIG. 5 are graphs of the time stability of the piezoelectric constant ($d_{31}$) for SSCP PVDF films stored at various temperatures over a period of time, the films having been produced with an $E_p$ of 0.55 MV/cm, a $T_p$ of 80° C. and S.R. of 4.5× with the dotted curves in FIG. 5 being similar graphs for a first stretched and then poled PVDF film, and FIG. 6 are graphs of the pyroelectric constants p vs. temperature T of PVDF films formed under optimum conditions with curve (a) being a graph for a SSCP PVDF film and (b) a graph for a first stretched and then poled film.

FIG. 4 is a graph of measured piezoelectric constants ($d_{31}$) vs poling temperature ($T_p$) for a number of film samples manufactured using different poling temperatures ($T_p$). These samples were produced using a poling field $E_p$ of 0.55 MV/cm and with a stretching ratio S.R. of 4.5×. The piezoelectric constants $d_{31}$ increase in value to a maximum of about 60 pC/N when the poling temperatures used were in the range of 70° to 85° C. The $d_{31}$ starts decreasing with increasing poling temperatures to a value of about 37 pC/N when poled at a temperature of 110° C. This drop in the value of $d_{31}$ obtained with samples formed at higher poling temperatures (85° C. to 110° C.) may be due to an increase in electrical conductivity which could reduce the actual effective poling fields for these samples.

The optimumized poling parameters for SSCP PVDF films obtained from FIGS. 2 to 4 are, therefore an $E_p$ of 0.55 MV/cm, a S.R. of 4.5× and a $T_p$ of 80° C. which provide a piezoelectric constant $d_{31}$ of about 60pC/N and a pyroelectric constant of about 6 $nC/cm^2K$ at 30° C. These are about double those of first stretched and then poled films. This twofold increase in $d_{31}$ may be attributed to a greater contribution of whole $\beta$ crystallite rotation than in first stretched and them poled films. The latter takes place in addition to the 60° step rotation of molecular dipoles in the field direction. X-ray scans of the samples show that SSCP films have a higher $\beta$ phase content than those that are first stretched and then poled.

Figure 5:
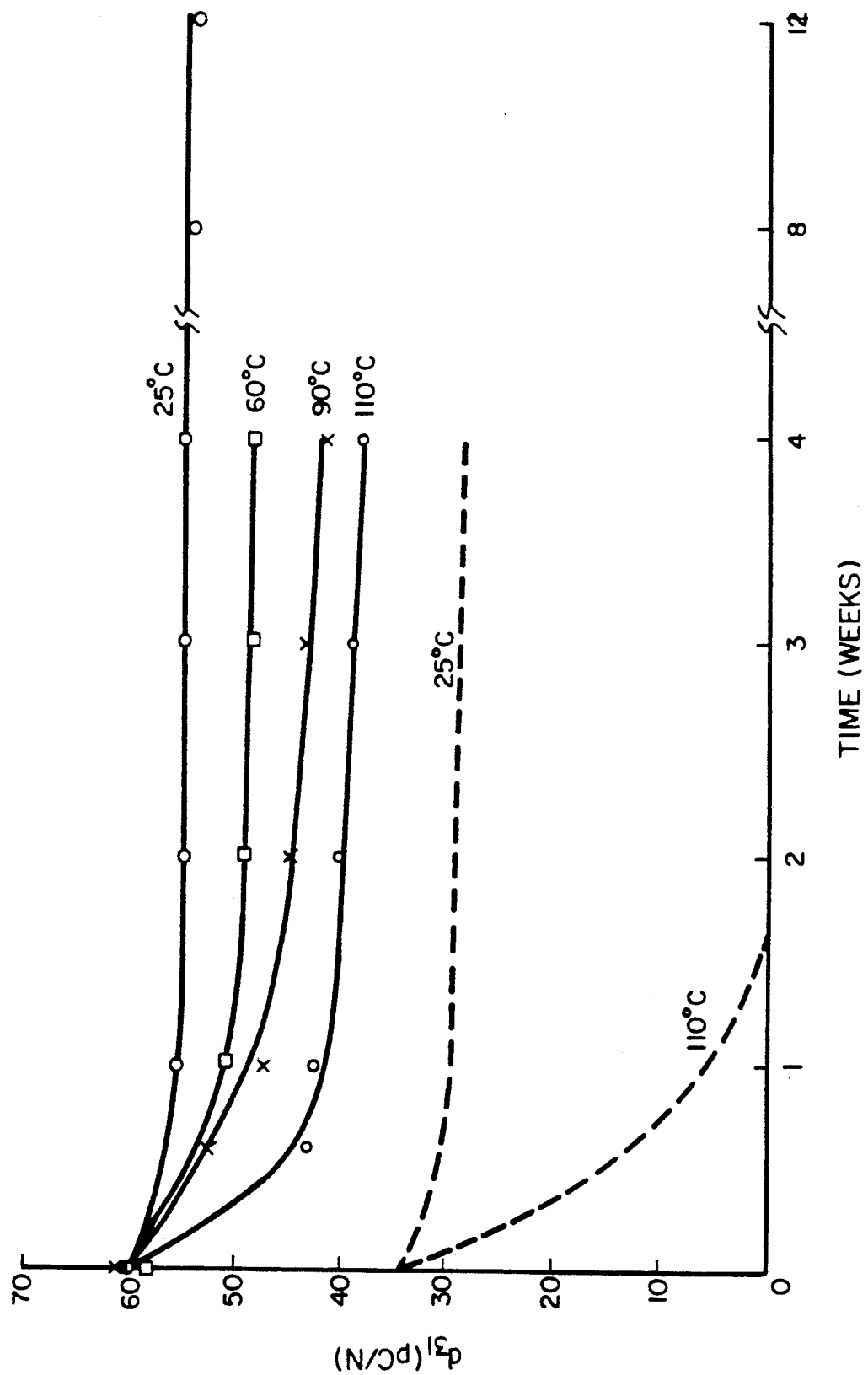

In addition to higher piezoelectric constants and pyroelectric constants, these SSCP PVDF films exhibit a greatly improved time stability for their piezoelectric constants $d_{31}$ when stored over a period of time at fixed temperatures. FIG. 5 is a graph which illustrates the time stability of $d_{31}$ for SSCP films formed under the previously mentioned optimum conditions when stored at various fixed temperature over a period of weeks. The SSCP PVDF film samples were stored in different ovens and kept at different fixed temperatures of 25° C., 60° C., 90° C. and 110° C. (solid lines curves in FIG. 5) over a number of weeks. These sample film were removed once per week to measure their $d_{31}$ at room temperature to obtain values for the four top curves in FIG. 5. The $d_{31}$ of the film stored at a 25° C. room temperature (R.T.) decreased by about 10% from its initial value of 60pC/N after one week and then stayed nearly constant for at least 11 more weeks. These SSCP films showed remarkably higher stability at all storage temperatures when compared with first stretched and then poled films as shown by the dotted lines in FIG. 5. This high stability supports the hypothesis that a greater proportion of whole $\beta$ crystallites are rotated during SSCP than in first stretched and then poled films. Higher thermal energy is, of course, required for rotation of the whole crystallite than for a dipole during decay of the polarization.

The time decay of $d_{31}$ at room temperature for SSCP films formed at varius stretching ratios (2× to 5×) and various poling temperatures (60° to 110° C.) were also investigated over a period of 12 weeks. The $d_{31}$ of these films (not shown in any of the graphs) stabilized between 80% to 90% of their initial value in all cases within one week.

FIG. 6 shows graphs of measured pyroelectric constants (p) vs. temperature for SSCP films (curve a) and for first stretched and then poled films (curve b) formed under the previously mentioned optimum conditions. The pyroelectric constants for these films are 6 $nC/cm^2K$ and 3.5 $nC/xm^2K$ at 30° C. respectively. The pyroelectricity was reversible, after the first heating run, on successive runs up to a temperature of 90° C. There is a small decrease in the magnitude of the pyroelectric current on cooling and reheating above a temperature of 90° C. The pyroelectricity may arise from orientation of dipoles, change in film dimensions or a reversible change in crystallinity with temperature wherein the last two factors are major contributors.

Various modifications may be made to the preferred embodiments without departing from the spirit and scope of the invention as defined in the appended claims. For instance, known ceramics with a high piezoelectric constants may be incorporated into the films before the films are subjected to SSCP.

The embodiments of the invention in which an exclusive property or privilege is claimed are defined as follows:

1. A method of manufacturing polymers films with enhanced piezoelectric and pyroelectric constants wherein films of polyvinylidene fluoride (PVDF) and co-polymers thereof are subjected to simultaneous stretching and corona poling at an elevated temperature, the corona poling being performed with a grid placed between a corona needle and a film, the grid being electrically connected to a controlled voltage source in order to control the surface potential of that film.

2. A method as defined in claim 1, wherein a poling field ($E_p$) of at least 0.5 MV/cm is maintained during the simultaneous stretching and corona poling step.

3. A method as defined in claim 1, wherein a stretching ratio (S.R.) between about 4× and 4.5× is reached during the simultaneous stretching and corona poling step.

4. A method as defined in claim 2, wherein a stretching ratio (S.R.) between about 4× and 4.5× is reached during the simultaneous stretching and corona poling step.

5. A method as defined in claim 1, wherein a poling temperature ($T_p$) of about 70° to 85° C. is maintained during the simultaneous stretching and corona poling step.

6. A method as defined in claim 2, wherein a poling temperature ($T_p$) of about 70° to 85° C. is maintained during the simultaneous stretching and corona poling step.

7. A method as defined in claim 3, wherein a poling temperature ($T_p$) of about 70° to 85° C. is maintained during the simultaneous stretching and corona poling step.

8. A method a as defined in claim 4, wherein a poling temperature ($T_p$) of about 70° to 85° C. is maintained during the simultaneous stretching and corona poling step.

9. A method as defined in claim 1, wherein the films are co-polymers of PVDF and TriFE and a poling temperature ($T_p$) of about 70° to 85° C. is maintained during the simultaneous stretching and corona poling step.

10. A method as defined in claim 9, wherein a stretching ratio (S.R.) between about 4× and 4.5× is reached during the simultaneous stretching and corona poling step.

11. A method as defined in claim 9, wherein a poling field ($E_p$) of at least 0.5 MV/cm is maintained during the simultaneous stretching and corona poling step.

12. A method as defined in claim 10, wherein a poling field ($E_p$) of at least 0.5 MV/cm is maintained during the simultaneous stretching and corona poling step.

13. A method as defined in claim 1, wherein a ceramic with a high piezoelectric constant is mixed into the polymer films before the films are subjected to simultaneous stretching and corona poling.

* * * * *